US 6,550,877 B1

(12) United States Patent
Anderson et al.

(10) Patent No.: US 6,550,877 B1
(45) Date of Patent: Apr. 22, 2003

(54) INTERCHANGEABLE AND MODULAR I/O PANEL

(75) Inventors: Paul H. Anderson, Beaverton, OR (US); Robert A. Eldridge, Portland, OR (US); Craig J. Jahne, Beaverton, OR (US); Christian Le, Hillsboro, OR (US); James D. Williams, Portland, OR (US); Lane C. Cobb, Ridgefield, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,651

(22) Filed: Mar. 30, 2001

(51) Int. Cl.$^7$ .................................................. H05K 7/18

(52) U.S. Cl. .................................. 312/223.2; 312/265.5

(58) Field of Search ............................ 312/223.2, 223.1, 312/265.5, 265.6, 257.1, 263; 361/684, 685, 686; 439/928.1

(56) References Cited

U.S. PATENT DOCUMENTS

| | | | | | |
|---|---|---|---|---|---|
| 5,235,493 A | * | 8/1993 | Yu | ............................ | 312/223.2 |
| 5,383,096 A | * | 1/1995 | Benson et al. | ............. | 174/17 R |
| 5,466,059 A | * | 11/1995 | Liu | ........................... | 312/223.2 |
| 5,593,220 A | * | 1/1997 | Seid et al. | ............ | 292/DIG. 38 |
| 5,992,955 A | * | 11/1999 | Yang | ........................... | 220/4.31 |
| 6,059,386 A | * | 5/2000 | Yu | ............................. | 220/4.32 |
| 6,339,536 B1 | * | 1/2002 | Buican et al. | .............. | 361/800 |

* cited by examiner

Primary Examiner—Janet M. Wilkens
(74) Attorney, Agent, or Firm—Blakely, Sokoloff, Taylor & Zafman LLP

(57) ABSTRACT

An input/output (I/O) panel with one chassis that supports multiple baseboards. In an aspect, the I/O panel has an extension to mate with a server chassis U-seam. In an aspect, the I/O panel includes a fastener for fastening to a server chassis, and unfastened from a server chassis, without the use of a tool. In an aspect, the fastener is a tab that fastens to a server chassis spring latch. In an aspect, an I/O panel is provided that maximizes EMI containment. In an aspect, an I/O panel is provided that maximizes thermal evacuation.

20 Claims, 5 Drawing Sheets

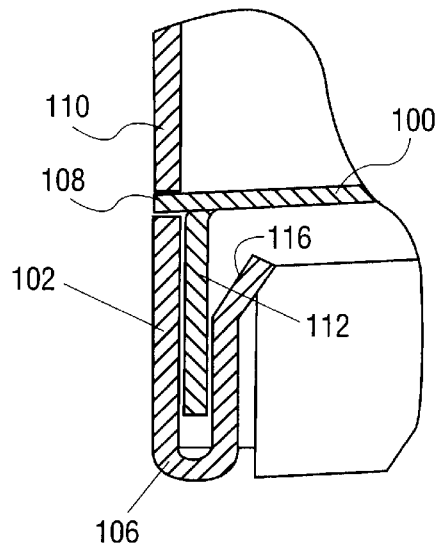
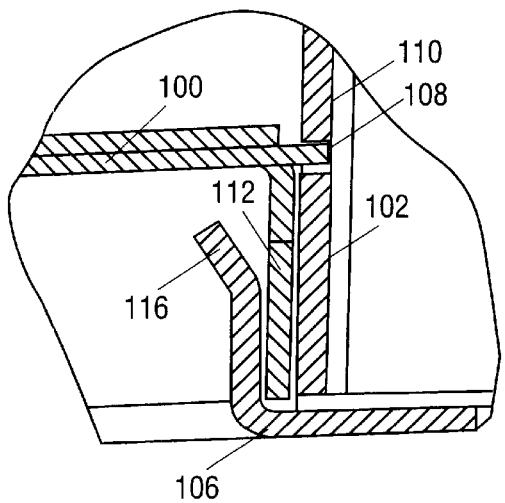
FIG. 3A          FIG. 3B
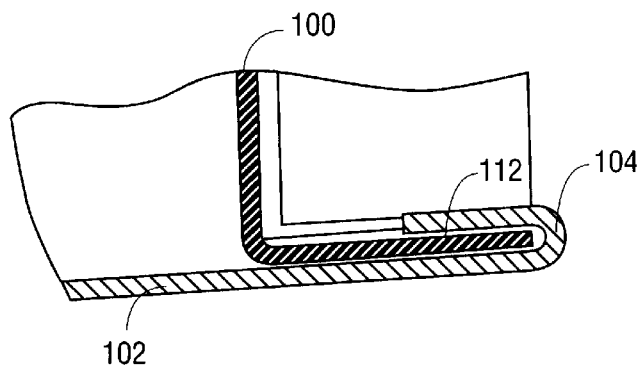
FIG. 4

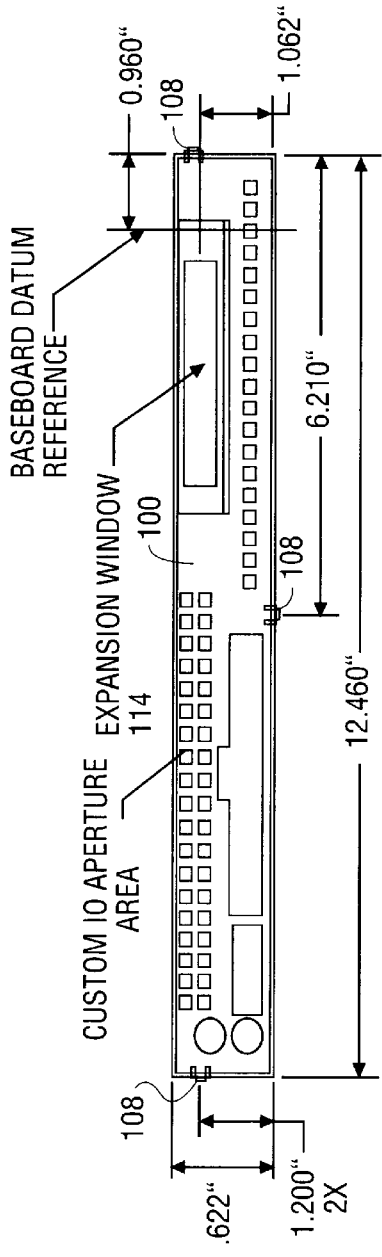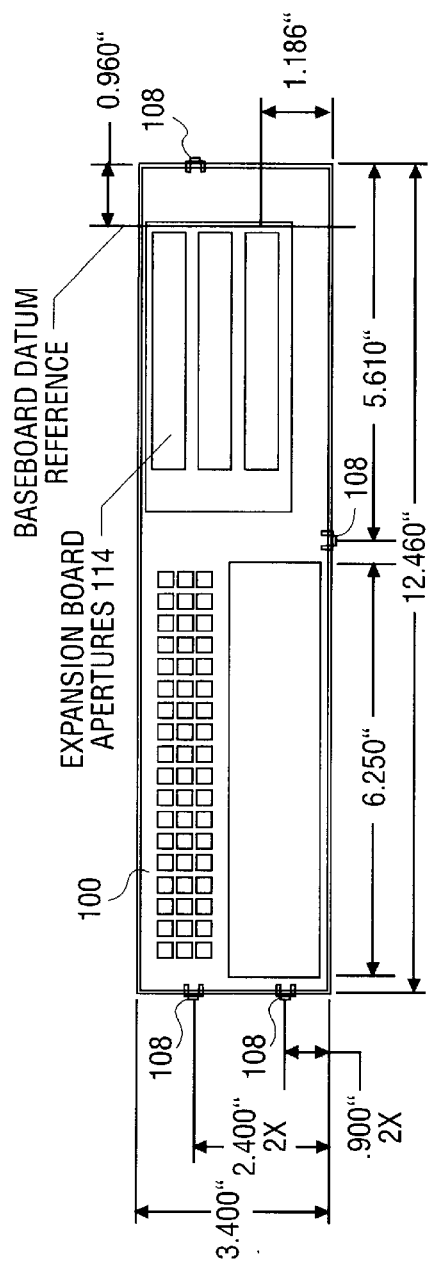

INTERCHANGEABLE AND MODULAR I/O PANEL

FIELD

This invention relates to an input/output (I/O) panel, more particularly, an I/O panel that is interchangeable between chassis such that one chassis can support multiple baseboards and that maximizes EMI containment and thermal evacuation.

BACKGROUND

Computer systems include a chassis that provides structural support and a housing for internal system components including electronic components, circuit boards and wiring. Chassis designs vary widely and include desktop models and tower models. Input/output (I/O) panels, the rear section of a chassis, which fit with a chassis, make up part of the housing for internal system components and are used to provide an interface between internal system components of a computer and the outside environment. The I/O panel joins with the baseboard (motherboard), which is the principal circuit board of a microcomputer. Computer baseboard designs vary and, currently, I/O panels are specifically designed, on a case-by-case basis, to fit with a specific computer baseboard design. Similarly, chassis designs vary and I/O panels are specifically designed, on a case-by-case basis, to fit with a specific chassis design.

Advanced technology extended (ATX) provides industry specifications for mechanical and electrical characteristics of personal computers including baseboard layout and mounting, I/O port access, limitations on chassis feature size and location, and power supply connectors.

BRIEF DESCRIPTION OF THE DRAWINGS

Additional advantages of the invention will become apparent upon reading the following detailed description and upon reference to the drawings, in which:

FIG. 3a depicts a cross-section view of the relationship of an I/O panel extension fitting with a U-seam of a chassis, and an I/O tab engaging a chassis latch, in an embodiment of the invention;

FIG. 3b depicts another cross-section view of the relationship of an I/O panel extension fitting with a U-seam of a chassis, and an I/O tab engaging a chassis latch, in an embodiment of the invention;

FIG. 4 depicts a cross-section view of the relationship of an I/O panel extension fitting with a U-seam of the bottom of a chassis, in an embodiment of the invention;

FIG. 6 depicts an I/O panel design having SSI required dimensions for a 1U system, in an embodiment of the invention; and FIG. 7 depicts an I/O panel design having SSI required dimensions for a 2U system, in an embodiment of the invention.

DETAILED DESCRIPTION

Figure 1:
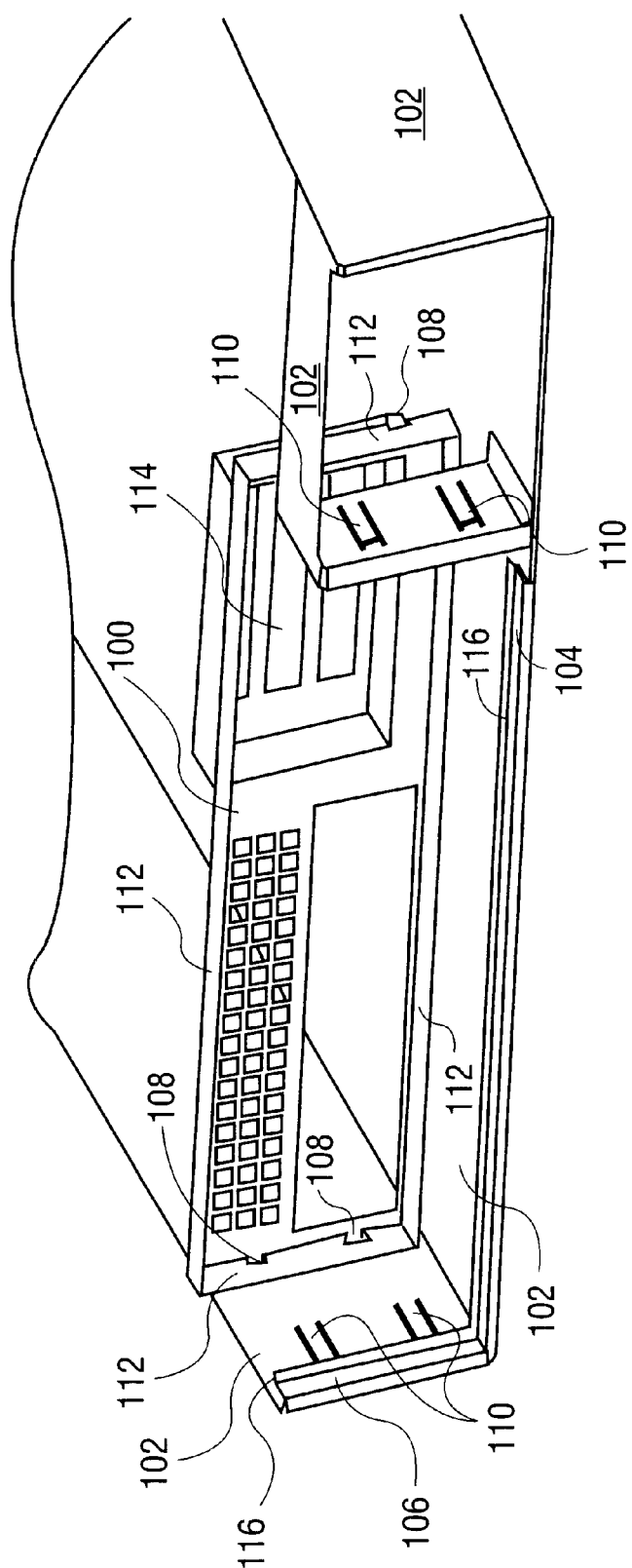
FIG. 1 depicts a perspective view of an I/O panel separated from a chassis, in an embodiment of the invention.

Exemplary embodiments are described with reference to specific configurations. Those of ordinary skill in the art will appreciate that various changes and modifications can be made while remaining within the scope of the appended claims. Additionally, well-known elements, devices, components, circuits, process steps and the like are not set forth in detail in order to, avoid obscuring the present invention.

Since standard specifications for common server system elements do not exist, original equipment manufacturers (OEM) must frequently redesign the basic infrastructure of their server products, a proprietary, expensive and time-consuming process.

Thin server baseboard requirements such as expansion cards and I/O connector placement make the ATX aperture valuable in some applications, but unusable in others. For example, the ATX aperture is unusable in the case of one-unit (1U) servers having double-stacked connectors that exceed a certain height. The 1U server is defined by the Electronic Industries Alliance EIA310-D Standard, published September 1992.

Currently, when a baseboard is replaced with a different baseboard, the chassis must concurrently be replaced. That is, when a baseboard is replaced, the I/O panel usually must be replaced, and since current I/O panels fit a limited number of chassis, the chassis must be replaced. In an embodiment, the invention provides an interchangeable and modular I/O panel that provides a means for allowing the installation of dissimilar baseboards into a chassis (with no modification to the chassis). Chassis re-use is achieved since the invention allows different baseboards to be used with one chassis. In an embodiment of the invention, an I/O panel is provided that accepts industry standard baseboards (motherboards) including ATX, Server System Infrastructure (SSI) and custom baseboards optimized for thin server products.

The electromagnetic interference (EMI) performance of a computer system is determined by the degree of noise suppression designed into the baseboard and the provisions for electromagnetic interference containment in the chassis design, including placement of internal subsystems and cables. In recent years, marketing requirements have changed for computer servers. Requirements now call for compliance to more stringent electromagnetic interference compatibility (EMC) limits such as the CISPR-22 European standard or the FCC "B" U.S. standard. These more restrictive standards, along with higher processor and video frequencies, call for more chassis containment provisions. The shorter wavelengths call for more frequent ground contacts and shorter apertures in the chassis design. The baseboard needs to tie into the chassis with the lowest electrical impedance possible. In an embodiment of the invention, an I/O panel that maximizes EMI containment is provided. In an embodiment of the invention, EMC limits, including CISPR-22 FCC "B" U.S. standards are achieved. In an embodiment of the invention, U-seams and I/O panel extensions are utilized, the U-seam being a U-shaped seam designed to join chassis panels to I/O panel to contain EMI in a chassis enclosure without the aid of metalized gaskets. In an embodiment, the U-seam is a sheet metal seam.

As thermal demands of today's computer systems increase, it has become necessary to manage the internal chassis temperature and the airflow to components. To meet increased thermal demands, more heat sinks or increased air velocities are required for cooling the components. To evacuate the highest possible heat, good system airflow is critical. Airflow is determined by the size and number of fans, vents, and ducts along with their placement in relation to the components and the airflow channels within the system. Also, acoustic noise constraints may limit the size and/or types of fans, vents and ducts that can be used in a particular design. To develop a reliable, cost effective thermal solution, many variables must be considered. Thermal characterization and simulation must be carried out at the entire system level accounting for the thermal requirements of each component. In an embodiment of the invention, an I/O panel that maximizes thermal evacuation is provided.

In the case that internal system components are changed, a changed I/O panel is often necessary to provide a matching interface that properly accommodates the internal system components. It may be necessary for an I/O panel to be changed at the time of manufacture, during implementation (system integration) or during system upgrades. In an embodiment, the invention provides I/O panels that are interchangeable between thin server chassis. The invention provides an I/O panel whereby one chassis can support multiple baseboards, including scaling baseboards from one-unit (1U) to two-unit (2U) chassis. In an embodiment, the invention provides an I/O panel to be used in chassis smaller than 1U. In an embodiment, the invention provides a modular I/O panel designed with standardized dimensions for efficient assembly and repair allowing use flexibility.

The design of the invention results in advantages including reduced chassis inventory requirements since a chassis will accommodate many baseboard designs. Further, research and development costs will be reduced: since I/O panel-chassis mating issues are resolved. This in turn reduces the time a computer system is developed and sent to market for sale.

As shown in FIG. 1, in an embodiment of the invention, I/O panel 100 fits with chassis 102 utilizing U-seams and fasteners. I/O panel 100 includes extension 112 which joins with base U-seam 104 and side U-seam 106. In an embodiment, extension 112 extends from three sides of I/O panel 100 and joins with U-seam 104 on three sides of chassis 102. However, any number of sides can be utilized. Additionally, mounting tab 108 fits with latch 110. In an embodiment, two mounting tabs are utilized on each side of I/O panel 100. However, the number of mounting tabs can be varied. In an embodiment, chassis 102 is a server chassis. In an embodiment, I/O panel 100 has dimensions to fit one of dissimilar 1U SSI compliant server chassis and dissimilar 2U SSI compliant server chassis.

Figure 2:
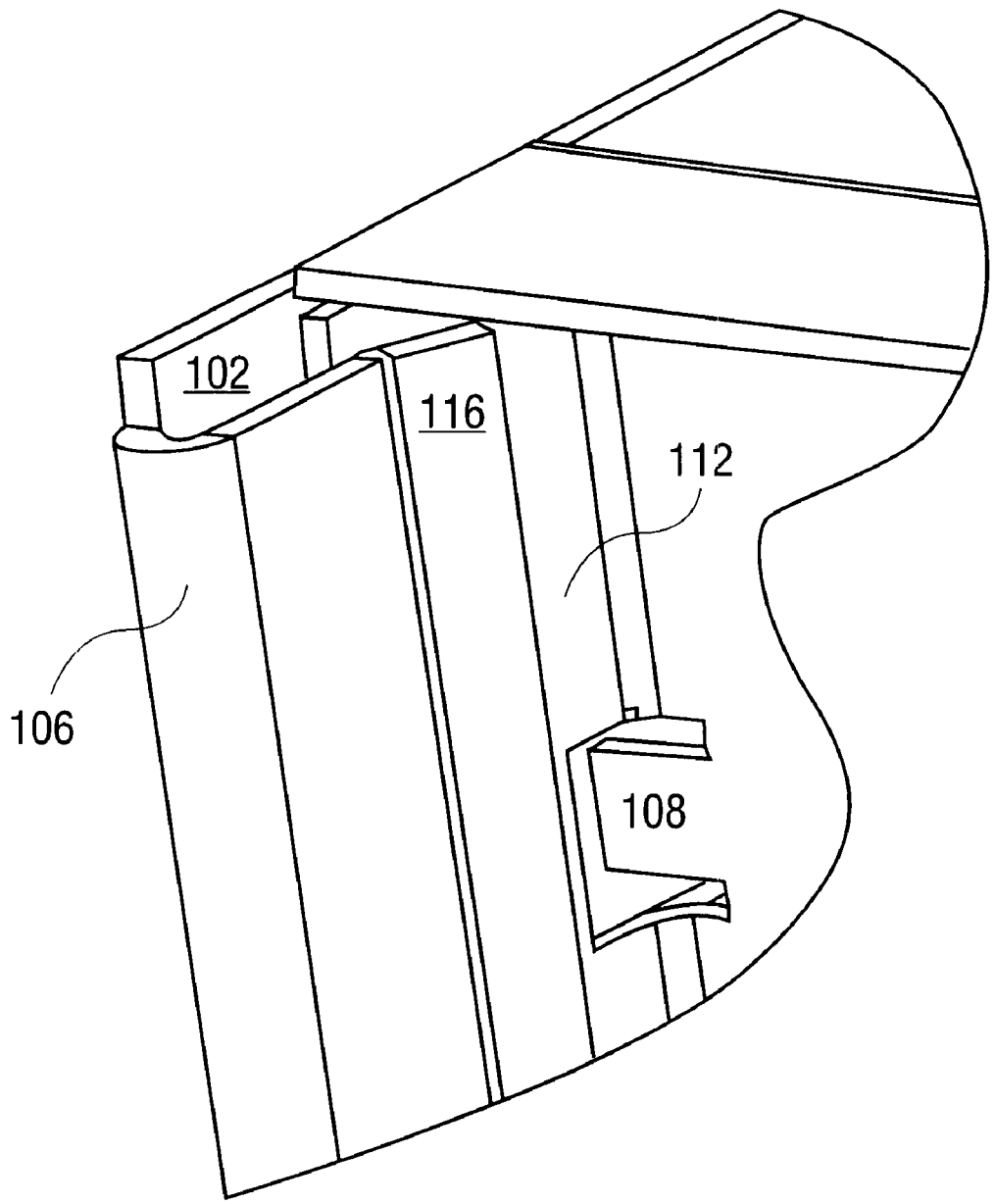
FIG. 2 is a partially exposed perspective view depicting the relationship of an I/O panel extension fitting with a U-seam of a chassis, in an embodiment of the invention.

FIG. 2 depicts the joining of I/O panel extension 112 to side U-seam 106, in an embodiment of the invention. Various factors must be taken into account when incorporating I/O panel extension 112 into base U-seam 104 and side U-seam 106. I/O panel extension 112 is an efficient EMI radiator when its length approaches one of one-quarter, one-half and a full wavelength of any frequencies radiating from the chassis enclosure. In an embodiment of the invention, I/O panel extension 112 length approaches one of one-quarter, one-half and a full wavelength of any frequencies radiating from the chassis enclosure.

In an embodiment of the invention, the depth of overlap between I/O panel extension 112 and base U-seam 104 (or side U-seam 106) is one of 6 mm and 7 mm, or any length in between 6 millimeters and 7 millimeters. In an embodiment of the invention, I/O panel extension 112 extends into a U-seam from 6 millimeters to 7 millimeters.

In an embodiment of the invention, I/O panel extension 112 is lead-in by lead-in 116, and received by one of base U-seam 104 and side U-seam 106 to assist in alignment and assembly of the I/O panel 100 to chassis 102.

FIG. 3a and FIG. 3b depict a cross-section view of the relationship of I/O panel extension 112 fitting with side U-seam 106. Additionally depicted is the engagement of mounting tab 108 with latch 110. The U-seam depicted in FIG. 3a differs from that of FIG. 3b since in FIG. 3b, U-seam 106 is formed allowing area for expansion window 114. In an embodiment, the inner width of side U-seam 106 is 1.5(t) in which t represents the width of the inner U-seam space, for mating with mounting tab 108. FIG. 4 depicts a cross-section view of the relationship of I/O panel extension 112 fitting with base U-seam 104, in an embodiment of the invention. Side U-seam 106 and base U-seam 104 restrain I/O Panel 100 in a planar manner. In an embodiment, besides EMI containment, U-seams are used on three sides of I/O Panel 100 for securely mounting and restraining I/O panel 100 to chassis 102.

In most chassis designs, U-seams must transition across a numerous edges and corners. The I/O panel extension that fits into a U-seam can require breaks in the corners to accommodate manufacturing requirements. This can make it difficult to create a continuous, unbroken U-seam when designing sheet metal components. In an embodiment, discontinuities in U-seams such as breaks or interruptions are avoided. Discontinuities can result in resonance and leakage that adversely affect overall shielding effectiveness. In an embodiment of the invention gaps or breaks are included in the U-seam in corners where the U-seam transitions from one edge to another. The gaps are designed to minimize the break created. Based on a containment requirement of 10 GHz., a maximum break of 1 cm would typically not degrade U-seam performance. However, in an embodiment, the maximum U-seam break is equal to, or less than, 0.5 cm in the corner areas due to the higher concentration of electrical current.

Figure 5:
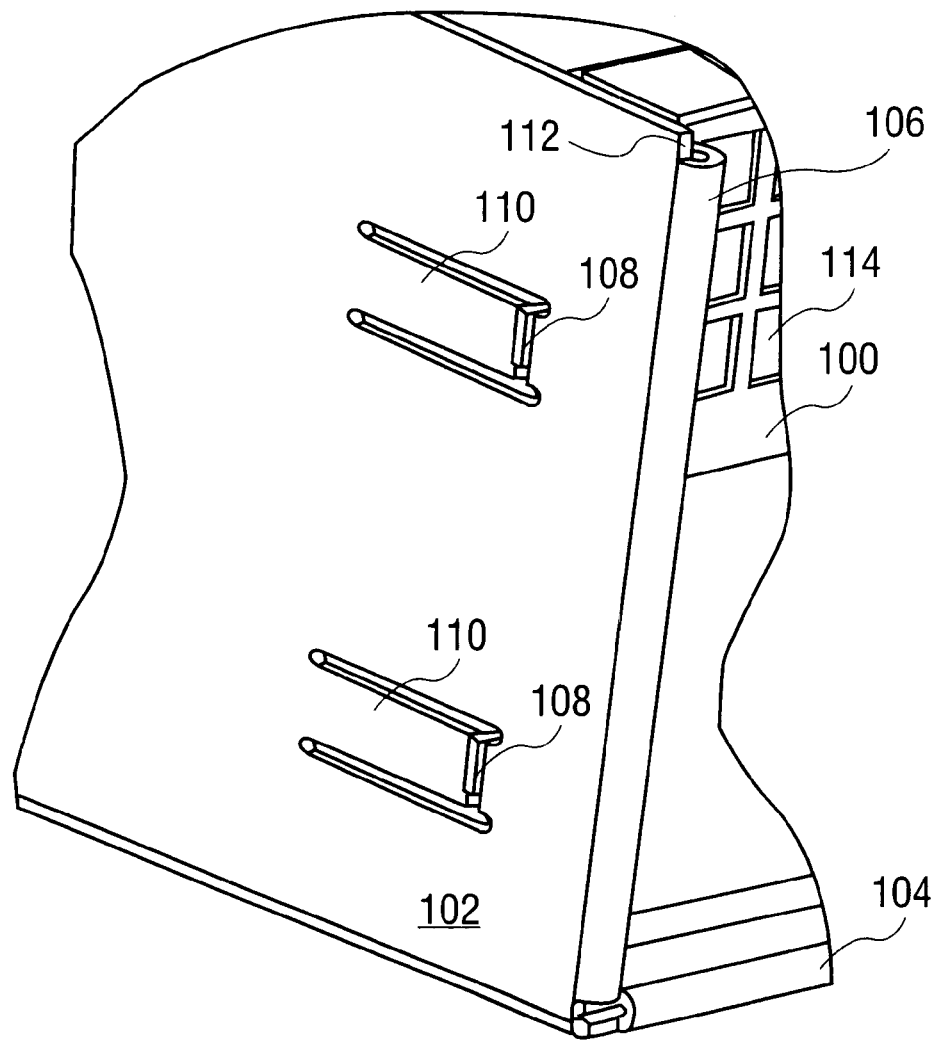
FIG. 5 depicts a side view showing an I/O tab engaging a chassis latch, in an embodiment of the invention.

Currently used I/O panels require tools to be attached to a chassis. The use of screws or something similar is currently used to permanently fix/attach an I/O panel to a mating server chassis. In an embodiment, the invention provides an I/O panel that is not intended to be permanently fixed to a chassis. In an embodiment, the invention provides a means for enabling an I/O panel to be attached to a chassis without the use of tools. As shown in FIG. 5, mounting tab 108 joins with latch 110, without the use of tools or screws, etc. In an embodiment, mounting tab 108 locates and locks I/O panel 100 to chassis 102. In an embodiment, two mounting tabs are utilized on opposing sides of I/O panel 100 and one mounting tab is utilized on the bottom of I/O panel 100. In an embodiment, latch 110 is a spring latch or similar.

In an embodiment of the invention, paint is not applied at U-seam interfaces. Paint can reduce shielding effectiveness and cause assembly issues due to added material thickness. In an embodiment of the invention an I/O panel is provided that allows a power supply to be mounted on either side of a chassis.

In an embodiment, the invention complies with Server System Infrastructure (SSI) specifications, SSI Specification for thin servers, version 0.99, published 1998. SSI is an initiative defining open industry specifications for common elements within server systems. SSI is developing specifications covering two primary server elements, namely power supplies and electronic bays. An electronics bay is a baseboard volume that includes processors, memory, PCI expansion boards, and all larger baseboard components. The SSI initiative is similar to desktop personal computer efforts such as ATX and new low profile motherboard form factor (NLX) in that it is working to define common packaging elements for the server market.

In an embodiment of the invention, I/O panel 100 is designed with the exemplary dimensions depicted in FIG. 6 for fitting with a one-unit (1U) chassis in compliance with SSI specifications. Positioning of mounting tab 108 as well as other dimensions are shown. In an embodiment of the invention, I/O panel 100 is designed with the exemplary dimensions depicted in FIG. 7 for fitting with a two-unit (2U) chassis in compliance with SSI specifications. Positioning of mounting tab 108 as well as other dimensions are shown. In an embodiment of the invention, for engagement of I/O Panel extension 112, the I/O panel sheet metal thickness does not exceed 0.050."

In an embodiment of the invention, a system is provided. The system includes a computer server including an I/O panel having an extension to mate with a U-seam that is a part of a chassis. A fastener is disposed on the I/O panel, not requiring a tool to fasten the I/O panel to the chassis and unfasten the I/O panel from the chassis. In an embodiment, the I/O panel has dimensions to fit dissimilar 1U SSI compliant server chassis. In an embodiment, the I/O panel has dimensions to fit dissimilar 2U SSI compliant server chassis. In an embodiment, the extension extends from three sides of the I/O panel. In an embodiment, the fastener includes a tab for engaging a spring latch disposed on the chassis. In an embodiment the system includes a computer server including an I/O panel having an extension to mate with a U-seam that is a part of a chassis. The I/O panel has dimensions to fit one of dissimilar 1U SSI compliant server chassis and dissimilar 2U SSI compliant server chassis. In an embodiment, the system includes a fastener, disposed on the I/O panel, not requiring a tool to fasten the I/O panel to the chassis and unfasten the I/O panel from the chassis. In an embodiment, the extension extends into the U-seam from 6 millimeters to 7 millimeters.

Having disclosed exemplary embodiments, modifications and variations may be made to the disclosed embodiments while remaining within the spirit and scope of the invention as defined by the appended claims.

What is claimed is:

1. An apparatus comprising:

an input/output (I/O) panel having an extension to mate with a U-seam that is a part of a chassis, the extension of the panel to mate with the U-seam on a bottom face, a first side face and an opposing second side face, the panel further having dimensions to fit one of dissimilar 1U Server System Infrastructure (SSI) compliant server chassis and dissimilar 2U SSI compliant server chassis.

2. The apparatus as in claim 1, further comprising:

a fastener, disposed on said I/O panel, not requiring a tool to fasten said I/O panel to said chassis and unfasten said I/O panel from said chassis.

3. The apparatus as in claim 2, wherein said fastener includes a tab for engaging a spring latch disposed on said chassis.

4. The apparatus as in claim 1, wherein said extension extends from three sides of said I/O panel.

5. The apparatus as in claim 1, wherein said extension extends into said U-seam from 6 millimeters to 7 millimeters.

6. An apparatus comprising:

an input/output (I/O) panel having an extension to mate with a U-seam that is a part of a chassis, the extension of the panel to mate with the U-seam on a bottom face, a first side face and an opposing second side face; and a fastener, disposed on said I/O panel, not requiring a tool to fasten said I/O panel to said chassis and unfasten said I/O panel from said chassis.

7. The apparatus as in claim 6, wherein said I/O panel having dimensions to fit dissimilar 1U Server System Infrastructure (SSI) compliant server chassis.

8. The apparatus as in claim 6, wherein said I/O panel having dimensions to fit dissimilar 2U Server System Infrastructure (SSI) compliant server chassis.

9. The apparatus as in claim 6, wherein said extension extends from three sides of said I/O panel.

10. The apparatus as in claim 6, wherein said fastener includes a tab for engaging a spring latch disposed on said chassis.

11. A system comprising:

a computer server including an input/output (I/O) panel having an extension to mate with a U-seam that is a part of a chassis, the extension of the panel to mate with the U-seam on a bottom face, a first side face and an opposing second side face, and the panel having a fastener disposed on said I/O panel not requiring a tool to fasten said I/O panel to said chassis and unfasten said I/O panel from said chassis.

12. The system as in claim 11, wherein said I/O panel having dimensions to fit dissimilar 1U Server System Infrastructure (SSI) compliant server chassis.

13. The system as in claim 11, wherein said I/O panel having dimensions to fit dissimilar 2U Server System Infrastructure (SSI) compliant server chassis.

14. The system as in claim 11, wherein said extension extends from three sides of said I/O panel.

15. The system as in claim 11, wherein said fastener includes a tab for engaging a spring latch disposed on said chassis.

16. A system comprising:

a computer server including an input/output (I/O) panel having an extension to mate with a U-seam that is a part of a chassis, the extension of the panel to mate with the U-seam on a bottom face, a first side face and an opposing second side face, and the panel having dimensions to fit one of dissimilar 1U Server System Infrastructure (SSI) compliant server chassis and dissimilar 2U SSI compliant server chassis.

17. The system as in claim 16, further comprising:

a fastener, disposed on said I/O panel, not requiring a tool to fasten said I/O panel to said chassis and unfasten said I/O panel from said chassis.

18. The system as in claim 17, wherein said fastener includes a tab for engaging a spring latch disposed on said chassis.

19. The system as in claim 16, wherein said extension extends from three sides of said I/O panel.

20. The system as in claim 16, wherein said extension extends into said U-seam from 6 millimeters to 7 millimeters.

* * * * *